US006461880B1

(12) United States Patent
Tsiang

(10) Patent No.: US 6,461,880 B1
(45) Date of Patent: Oct. 8, 2002

(54) METHOD FOR MONITORING SILICIDE FAILURES

(75) Inventor: Jerry Tsiang, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/892,752

(22) Filed: Jun. 28, 2001

(51) Int. Cl.[7] .............................................. H01L 21/66
(52) U.S. Cl. ........................ 438/14; 438/15; 438/238; 257/15; 257/48; 257/22
(58) Field of Search ................. 438/14, 15, 18, 438/238; 257/15, 22, 48

(56) References Cited

U.S. PATENT DOCUMENTS

| | | | | |
|---|---|---|---|---|
| 5,656,510 A | | 8/1997 | Chrapacz et al. ........... 438/394 |
| 5,963,780 A | * | 10/1999 | Ling et al. ..................... 438/14 |
| 6,001,663 A | * | 12/1999 | Ling et al. ..................... 438/17 |
| 6,022,749 A | * | 2/2000 | Davis et al. ................... 438/14 |
| 6,165,807 A | * | 12/2000 | Lee et al. ...................... 438/18 |
| 6,267,158 B1 | * | 7/2001 | Saga ............................. 141/94 |
| 6,281,052 B1 | * | 8/2001 | Shinmura .................... 438/142 |
| 6,285,045 B1 | * | 9/2001 | Itabashi et al. .............. 257/211 |
| 6,342,421 B1 | * | 1/2002 | Mitani et al. ................ 438/300 |

* cited by examiner

Primary Examiner—John F. Niebling
Assistant Examiner—Olivia Luk

(57) ABSTRACT

A method for monitoring silicide failures in the semiconductor process provides P-channel gate oxide capacitors on a semiconductor wafer. The breakdown voltages of the P-channel oxide gate capacitors are measured. With higher rapid thermal anneal (RTA) temperatures, an increased number of short failures occur in the P-channel gate oxide capacitors. Based on a correlation of the P-channel gate oxide capacitor failures and the RTA temperatures, the optimum RTA temperature for the silicide process is determined.

5 Claims, 2 Drawing Sheets

METHOD FOR MONITORING SILICIDE FAILURES

FIELD OF THE INVENTION

The present invention relates to the field of semiconductor processing, and more particularly, to the detection of silicide failures and the determination of a maximum annealing temperature that prevents silicide failures from occurring.

BACKGROUND OF THE INVENTION

Fabrication of a semiconductor device and an integrated circuit thereof begins with a semiconductor substrate and typically employs film formation, ion implantation, photolithography, etching, and deposition techniques to form various structural features in or on a semiconductor substrate to attain individual circuit components which are then interconnected to ultimately form an integrated semiconductor device. Escalating requirements for high densification and performance associated with ultra large-scale integration (ULSI) semiconductor devices require smaller design features, and increased transistor and circuit speeds, high reliability and increased manufacturing throughput for competitiveness.

As device dimensions and feature sizes decrease to the deep sub-micron range, performance difficulties escalate, particularly those caused by an increase in a sheet resistance in the contact areas through the source and drain regions and junction leakage as junction layer thickness decreases. To ameliorate the higher electrical resistance caused by shrinking features, the use of self-aligned, highly electrically conductive refractory metal silicides, i.e., "silicides" (derived from self-aligned silicide), has become commonplace in the manufacture of IC semiconductor devices, as for example in the manufacture of MOS type transistors.

Salicide technology comprises forming metal silicide layers on the source/drain regions and/or on the gate electrode of a semiconductor device in a self-aligned manner. A conventional approach to reduce resistivity involves forming a multi-layered structure comprising a low resistance refractory metal silicide layer on a doped polycrystalline silicon, typically referred to as a polycide. Salicide technology reduces parasitic sheet and contact resistance in the source and drain and diffusion layers and the gate electrode that results from scaling down the source and drain junctions in polycrystalline silicon line width.

Refractory metals commonly employed in salicide processing include platinum (Pt), titanium (Ti), and cobolt (Co), each of which forms very low resistivity phases with silicon (Si), e.g., $PtSi_2$, $TiSi_2$, and $CoSi_2$. In practice, the refractory metal is deposited at a uniform thickness over all exposed surface features of a Si wafer, preferably by means of physical vapor deposition ("PVD") process, e.g. sputtering from a target utilizing an ultra high-vacuum, multi-chamber DC magnetron or RF sputtering system. Such PVD tools are commercially available, as for example by Applied Materials, Inc., of Santa Clara, Calif.; and by MRC of Gilbert, Ariz.

In MOS transistor formation, deposition is generally performed both after a gate etch and after source/drain formation. After deposition, the refractory metal layer blankets the top surface of the gate electrode, typically formed of a heavily-doped polysilicon, the silicon oxide, nitride, or oxynitride spacer walls on the opposing side surfaces of the gate electrode, silicon oxide isolation regions formed in the silicon substrate between adjacent active device regions, and the exposed surfaces of the substrate where the source and drain regions are formed or will subsequently be formed. As a result of thermal processing, e.g., a rapid thermal annealing ("RTA") performed in an inert atmosphere, the refractory metal layer reacts with the source and drain surfaces and the top surface of the polysilicon gate metal silicide layers. Unreacted portions of the refractory metal layer, e.g., on the silicon oxide, nitride, or oxynitride spacer walls and the silicon oxide isolation regions, are then removed, as by a wet chemical etching process selective to metal silicide portions.

The RTA step used to anneal refractory metal and silicon to form silicide is very critical. When the temperature of the RTA is too low, or the process time is too short, incomplete silicide formation may result. This leads to very poor transistor performance. On the other hand, if the RTA is too high, transistor leakage and short failures may occur. These leakage or short failures are due to the creeping of silicide from gate to source/drain areas. It is therefore important to determine the highest possible RTA temperature for a silicide process that does not produce transistor short failures.

The conventional process for determining the highest possible RTA temperature involves the formation of silicide on a semiconductor wafer and then performing scanning electron microscope (SEM) inspection of cross-sectioned samples. The SEM inspection reveals leakage or shorts of the transistor. Unfortunately, a relatively long time is required to prepare the sample and locate the failure sites. Furthermore, the number of samples that can be prepared for examination is limited.

SUMMARY OF THE INVENTION

There is a need for a method of monitoring silicide failures of a semiconductor wafer, and also a need to determine the highest possible RTA temperature to form silicide without creating transistor short failures.

In certain embodiments of the invention, a method of determining a rapid thermal anneal (RTA) for a silicide process is provided. The method comprises the steps of forming a plurality of semiconductor wafers, each wafer having a gate oxide capacitor set. Silicide is formed on each wafer, employing a different RTA for each wafer. The breakdown voltages of the gate oxide capacitor set of each wafer are measured. The wafer is identified which has the highest RTA among those wafers that have a gate oxide capacitor set with measured breakdown voltage greater than a specified threshold. The RTA for the silicide process is the RTA for the identified wafer.

Another aspect of the present invention provides a method of determining a maximum process temperature for a silicide process and comprises the steps of forming silicide at different process temperatures on respective semiconductor wafer. The breakdown voltages on gate oxide capacitors are measured on the semiconductor wafers. The semiconductor wafer with silicide formed at the highest process temperature and measured breakdown voltages above a threshold value is identified. The maximum process temperature for the silicide process is equal to the process temperature for the identified semiconductor wafer.

The present invention takes advantage of the discovery by the present inventors that the number of leakage or a silicide short failures of certain capacitors is directly related to RTA temperatures. For example, a P-channel capacitor with gate edge structure is extremely sensitive to silicide failures or bridging caused by excessive RTA temperature. In other words, the higher the RTA temperature, the greater the number of short failures of P-channel gate edge capacitors (or gate oxide capacitors). Based on the correlation of the P-channel gate edge capacitor failures in the RTA temperatures, the optimum RTA temperature is readily determined. Furthermore, the present invention can also be used to monitor the uniformity of the RTA equipment.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the monitoring of silicide failures during semiconductor processing. These problems are solved, in part, by the present invention which provides a method for monitoring gate edge capacitor failures, determining optimum RTA temperatures, and monitoring the uniformity of RTA equipment. This is achieved by measuring the breakdown voltages of P-channel gate edge capacitors (or "gate oxide capacitors"). It was found by the inventors of the present invention that the number of leakage or silicide short failures of P-channel gate edge capacitors is directly related to the RTA temperatures employed in silicide formation because P-channel capacitors with gate edge structures are very sensitive to this problem. The higher the RTA temperature, the more leakage and short failures are present in P-channel gate edge capacitors. By correlating the number of P-channel gate edge capacitor failures and the RTA temperatures, the determination of the optimum RTA temperature is readily obtained. By measuring the breakdown voltages of the P-channel gate edge capacitors, the uniformity of RTA equipment may be monitored.

Figure 1:
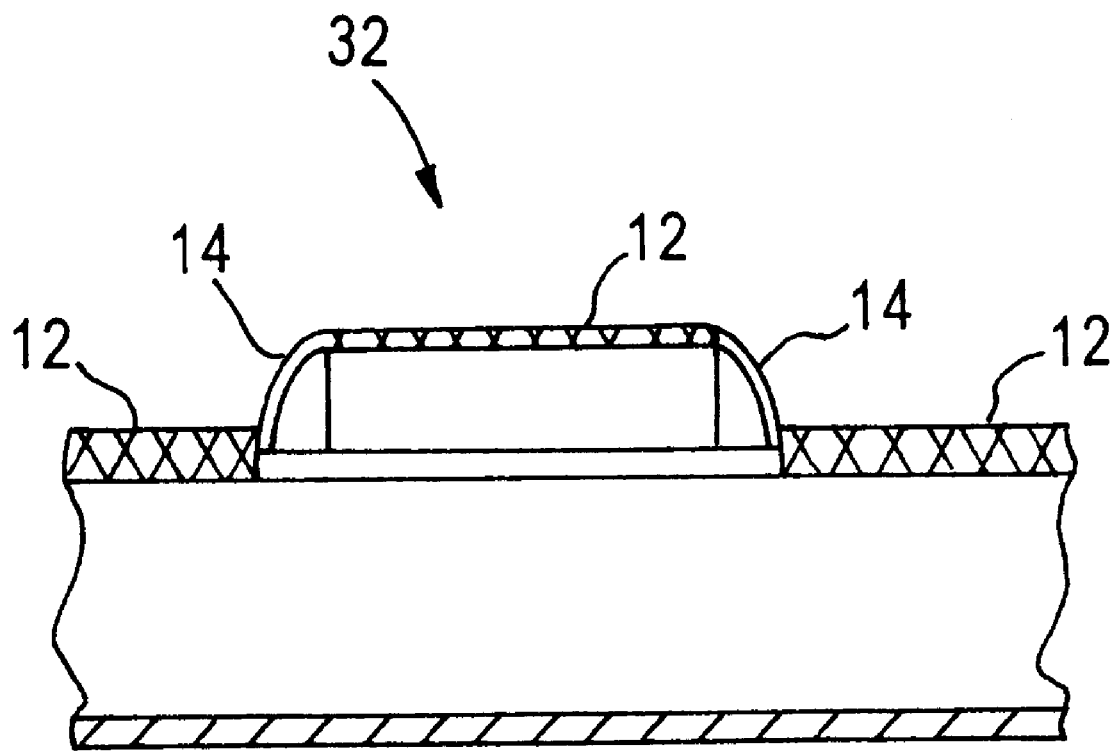
FIG. 1 is a cross-section of a P-channel gate oxide capacitor in accordance with the present invention, depicting a silicide failure due to excessive RTA temperature in silicide formation.
Figure 2:
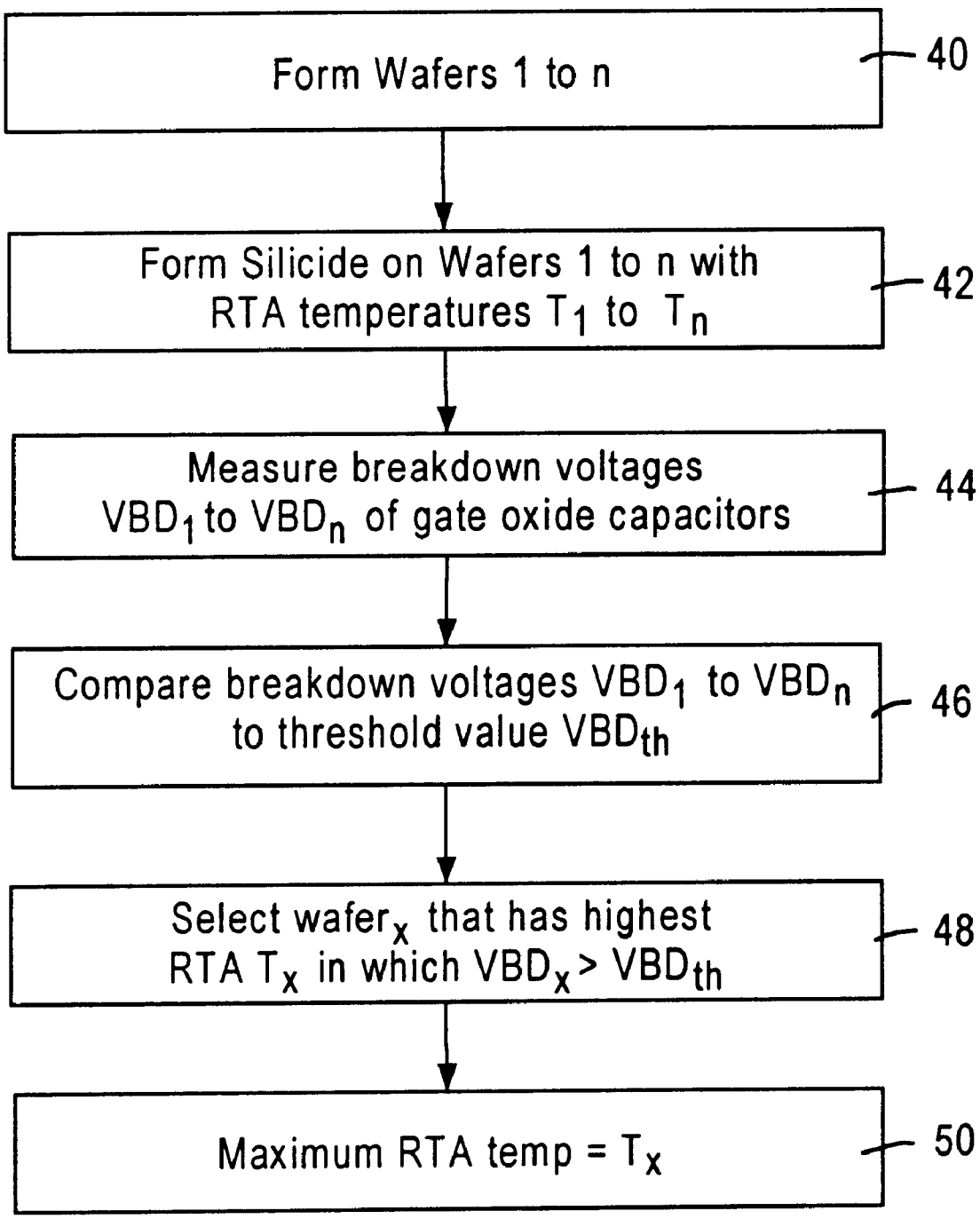
FIG. 2 is a flow chart of a method for determining the maximum RTA temperature for a silicide process in accordance with embodiments of the present invention.

The present invention takes advantage of the increased sensitivity of P-channel gate oxide capacitors to silicide failures caused by excessive RTA temperatures during silicide formation, in comparison to the sensitivity exhibited by area capacitors. A schematic depiction of a cross-section of a gate oxide capacitor 32 used in the present invention is depicted in FIG. 1. In this Figure, the capacitor 10 has a surface on which silicide 12 has been formed. However, in this example, the RTA temperature is excessive, causing a silicide bridge 14 to form. This creates short failures in the P-channel gate edge capacitor 10. The silicide bridging on the capacitor 10 indicates that the silicide formed over the remaining portions of the semiconductor chip will cause transistor leakage and short failures.

The measurement of the breakdown voltages of the gate oxide capacitors 32 is performed in a conventional manner, well known to those of ordinary skill in the art.

FIG. 3 depicts a flow chart of a method of determining maximum RTA temperature of a silicide process in accordance with embodiments of the resent invention. In step 40, a number of wafers (n) are formed. The wafers 30 then have silicide formed on them at different RTA temperatures respectively, in step 42. Hence, the wafers, from wafer, to wafer, will have silicide formed on them with respective RTA temperatures of $T_1$ to $T_n$, where $T_1 < T_2 < \ldots < T_n$. This produces a number of wafers, each being formed with silicide on the wafers under different RTA temperatures.

In alternate embodiments of the invention, wafers with different temperatures employed in processing the silicide are provided for testing, so that the method of the present invention includes only the testing steps, and not the steps of forming the wafers or the silicide.

In step 44, the breakdown voltages $V_{BD1} - V_{BDD}$ are measured for at least the gate oxide capacitors 32 for each of the wafers 1 to n. In certain embodiments of the invention, the breakdown voltages are measured for the first set of capacitors (the gate oxide capacitors 32, for example). The breakdown voltages are measured in a conventional manner.

The breakdown voltages of $V_{BD1}$ to $V_{BDn}$ are compared to a threshold value $V_{BDth}$ in step 46. The threshold value $V_{BDth}$ is set such that breakdown voltages below $V_{BDth}$ are considered low breakdown voltages that indicate leakage or short failures due to the creeping of silicide.

In step 48 the wafer (wafer$_x$) is selected that has the highest RTA temperature ($T_x$) in which the breakdown voltage $V_{BDx} > V_{BDth}$. Next, in step 50, the maximum silicide process temperature is selected as the temperature $T_x$. With this embodiment of the method of the present invention, the maximum temperature for the RTA steps is determined as the silicide process temperature $T_x$.

The threshold value of the breakdown voltage ($V_{BDth}$) (not to be confused with the threshold voltage Vt of a transistor) depends on the thickness of the oxide. Hence, a thinner oxide will have a lower breakdown voltage than a thicker oxide. A breakdown voltage that is less than approximately 14 mV/cm will be considered low and below the threshold value of the breakdown voltage $V_{BDth}$.

In certain embodiments of the invention, only the breakdown voltages of the P-channel gate oxide capacitors 32 are measured, and the silicide process temperature is determined based upon the measured breakdown voltages of this first set of capacitors. In other embodiments of the invention, the breakdown voltages of the area capacitors 36 are also measured. In these embodiments, if only the P-channel gate edge capacitors 32 of any wafer have low breakdown voltages or short failures, this indicates that the leakage or short failures are due to the creeping of silicide from gate to source/drain areas. In certain embodiments of the invention, the process of determining the ideal RTA is an iterative process that involves forming a wafer with a first RTA temperature for the silicide, and measuring the breakdown voltages to determine if there are low breakdown voltages or short failures in the gate oxide capacitors. Depending upon the results, another wafer is then formed with a higher or lower RTA temperature. By using an iterative process, the maximum RTA temperature may be quickly ascertained with a low number of test wafers.

The uniformity of RTA equipment may also be tested with the present invention by comparing the breakdown voltages of gate oxide capacitors at different positions of the wafer. Based on the breakdown voltage map, the uniformity of RTA processing is known.

The present invention provides an effective and rapid testing of wafers to determine silicide failures on the wafers, as well as a method for determining the optimum RTA temperature for silicide processes. This is achieved in a non-invasive manner, reducing the time and costs required to determine silicide failures in semiconductor processing.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of determining a rapid thermal anneal temperature (RTA) for a silicide process, comprising the steps of:

forming a plurality of semiconductor wafers, each chip having a gate oxide capacitor set;

forming silicide on each wafer, employing a different RTA for each wafer;

measuring breakdown voltages of the gate oxide capacitor set and the area capacitor set of each chip;

identifying which wafer has the highest RTA among those wafers that have a gate oxide capacitor set with measured breakdown voltage greater than a specified threshold value;

wherein the RTA for the silicide process is the RTA for the identified wafer.

2. The method of claim 1, wherein the gate oxide capacitors are P-channel.

3. A method of determining a maximum process temperature for a silicide process, comprising the steps of:

forming silicide at different process temperatures on respective semiconductor wafers;

measuring breakdown voltages of gate oxide capacitors on the semiconductor wafers; and identifying the semiconductor wafer with silicide formed at the highest process temperature and having measured breakdown voltages above a threshold value, the maximum process temperature for the silicide process being equal to the process temperature for the identified semiconductor wafer.

4. The method of claim 3, wherein the gate oxide capacitors are P-channel gate oxide capacitors.

5. The method of claim 4, wherein the P-channel gate oxide capacitors have enhanced polygate edges and are on a scribe line of the semiconductor wafer.

* * * * *